US009298603B2

(12) United States Patent
Schuette

(10) Patent No.: US 9,298,603 B2
(45) Date of Patent: Mar. 29, 2016

(54) NAND FLASH-BASED STORAGE DEVICE AND METHODS OF USING

(71) Applicant: OCZ Storage Solutions, Inc., San Jose, CA (US)

(72) Inventor: Franz Michael Schuette, Colorado Springs, CO (US)

(73) Assignee: OCZ Storage Solutions Inc., San Jose, CA (US)

( * ) Notice: Subject to any disclaimer, the term of this patent is extended or adjusted under 35 U.S.C. 154(b) by 426 days.

(21) Appl. No.: 13/678,192

(22) Filed: Nov. 15, 2012

(65) Prior Publication Data

US 2013/0124787 A1    May 16, 2013

Related U.S. Application Data

(63) Continuation-in-part of application No. 13/251,491, filed on Oct. 3, 2011, now Pat. No. 8,694,754.

(60) Provisional application No. 61/559,951, filed on Nov. 15, 2011, provisional application No. 61/532,680, filed on Sep. 9, 2011.

(51) Int. Cl.
| G06F 12/00 | (2006.01) |
| G06F 12/02 | (2006.01) |
| G11C 11/56 | (2006.01) |
| G11C 16/04 | (2006.01) |
| G11C 16/10 | (2006.01) |
| G11C 16/34 | (2006.01) |

(52) U.S. Cl.
CPC ........ *G06F 12/0246* (2013.01); *G11C 11/5628* (2013.01); *G11C 16/0483* (2013.01); *G11C 16/10* (2013.01); *G11C 16/3495* (2013.01); *G06F 2212/7202* (2013.01); *G06F 2212/7204* (2013.01); *G06F 2212/7205* (2013.01); *G06F 2212/7206* (2013.01); *G06F 2212/7211* (2013.01); *G11C 2211/5641* (2013.01)

(58) Field of Classification Search
CPC .................... G06F 12/0246; G06F 2212/7202; G06F 2212/7204–2212/7206; G06F 2212/7211
See application file for complete search history.

(56) References Cited

U.S. PATENT DOCUMENTS

| 8,694,754 | B2 * | 4/2014 | Schuette et al. ............... 711/202 |
| 2009/0129155 | A1 * | 5/2009 | Honda et al. ............. 365/185.03 |
| 2009/0327590 | A1 * | 12/2009 | Moshayedi ................... 711/103 |

* cited by examiner

*Primary Examiner* — Shawn X Gu
(74) *Attorney, Agent, or Firm* — Hartman Global IP Law; Gary M. Hartman; Michael D. Winter

(57) ABSTRACT

A solid state drive having at least one NAND flash memory component organized in blocks, pages and cells. Each cell is adapted to store at least two bits. Each block of the memory component is adapted to be dynamically configured to store at least one bit per cell using a first mode of operation and dynamically configured to store at least two bits per cell using a second mode of operation while the mass storage device is operating, wherein the first mode of operation entails programming fewer bits of a cell in fewer passes as compared to the second mode of operation.

20 Claims, 1 Drawing Sheet

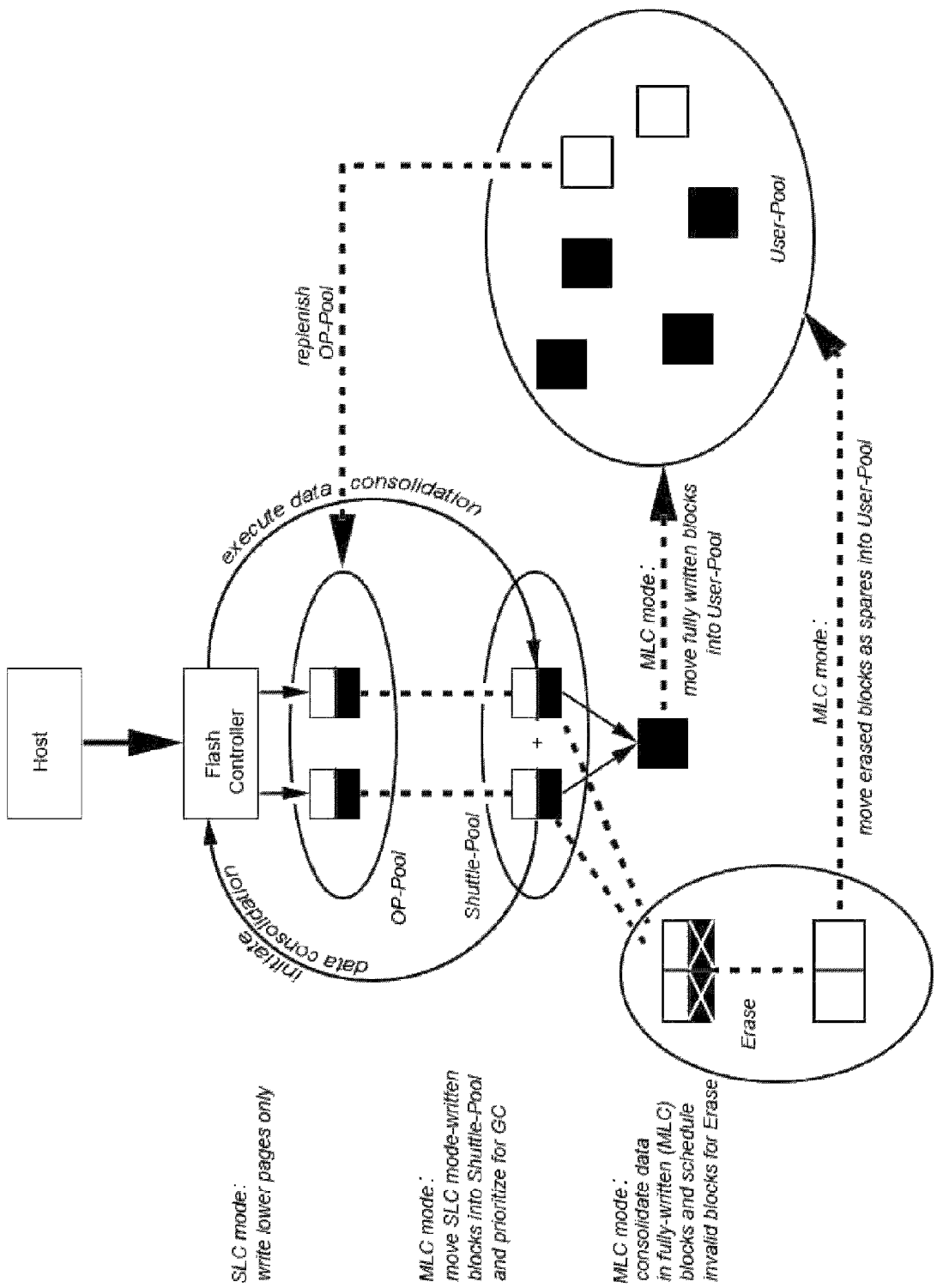

NAND FLASH-BASED STORAGE DEVICE AND METHODS OF USING

CROSS REFERENCE TO RELATED APPLICATIONS

This application claims the benefit of U.S. Provisional Application No. 61/559,951, filed Nov. 15, 2011. This application further claims the benefit of, and is related to, as a Continuation-in-Part (CIP), U.S. patent application Ser. No. 13/251,491 (issued as U.S. Pat. No. 8,694,754), filed Oct. 3, 2011, which claims the benefit of U.S. Provisional Application No. 61/532,680, filed Sep. 9, 2011. The contents of these applications are incorporated herein by reference.

BACKGROUND OF THE INVENTION

The present invention generally relates to mass storage devices adapted for use with personal computers, servers, or other host systems. Specifically, the invention relates to a solid state drive (SSD) containing NAND flash-based memory components that are dynamically reconfigurable to operate in different modes, one being relatively faster and another effectively multiplying the capacity of the drive.

NAND flash memory has become the storage medium of choice for solid state drives used in personal computers and servers. Flash memory, regardless of whether it is NAND or NOR technology that is implemented, uses floating gate transistors (FGT) to store data wherein each FGT constitutes a cell as the smallest physical unit to hold a bit. NAND flash cells are organized in what are commonly referred to as pages, which in turn are organized in predetermined sections of the component referred to as memory blocks (or sectors). Each cell of a NAND flash memory component has a top or control gate (CG) and a floating gate (FG), the latter being sandwiched between the control gate and the channel of the cell. The floating gate is separated from the control gate by an oxide layer and from the channel by another oxide layer, referred to as the tunnel oxide. Data are stored in a NAND flash cell in the form of a charge on the floating gate which, in turn, defines the channel properties of the NAND flash cell by either augmenting or opposing the charge of the control gate. The process of programming (writing 0's to) a NAND cell requires applying a programming voltage to the control gate, which causes the injection of electrons into the floating gate by quantum mechanical tunneling. The process of erasing (writing 1's to) a NAND cell requires removing the programming charge from the floating gate by applying an erase voltage to the device substrate, which pulls electrons from the floating gate. Data are stored, retrieved and erased on a block-by-block basis. In view of the above, the operational principle of a NAND flash memory component is that the floating gate, which is interposed between the control gate and channel, is charged to have an additional charge that supplements or counteracts a control voltage applied to the control gate. At a certain threshold the control voltage will switch the transistor "On" or "Off." Accordingly, programming or writing (and erasing) of a NAND cell entails charging of its floating gate, whereas reading of data stored in a NAND cell entails sensing the threshold of the control voltage at which the transistor switches.

One of the key events that has enabled NAND flash to become competitive for mass storage devices or solid state drives was its evolution to be able to store two bits per cell, which entails sensing of the switching threshold to unambiguously identify four different voltage levels. This particular "generation" of flash memory is called multi-level cell (MLC) flash memory in order to distinguish it from the older single-level cell (SLC) flash memory which could only store a single bit per cell. The relation between the number of bits stored in each cell and the voltage levels (lv) that need to be distinguishable is the simple binary function $n(lv)=2^n(bit)$.

For example a single level cell storing only one bit will require $2^1$ levels, above and below a trip-voltage threshold to be uniquely identifiable, whereas a multi-level cell with two bits per cell will require separation of $2^2$ (4) levels. In the upcoming migration to triple level cell (TLC) technology, $2^3$ (8) different levels need to be distinguishable.

Most current flash cells operate at a voltage sensing range of less than 2V, depending on the manufacturer and the process. Each bit value has a quasi-Gaussian distribution across all cells used with reference points as the threshold between digital 0 and 1 values. As cells age and more electrons become trapped in the oxide layer separating the floating gate from the substrate, these trapped charges will cause the distribution of "effective" programming charges to shift. In other words, the transistor does not know where the charges are and, therefore, charges trapped in the oxide layer will have the same effect as charges programmed into the floating gate. The result is that trapped charges in the oxide layer are additive to the floating gate charge. This results in incremental difficulties to maintain the correct charges for the desired bit values between the reference points since additive action of the oxide trapping can lead to over-programming or else failure to properly erase any given cell within a block.

Programming of cells is done through incremental step pulse programming (ISPP), wherein the desired value is correlated with a look-up table that takes into account any charges that are already present. The latter only applies to MLC or TLC flash memory since SLC memory programming will always start at a fully erased state of the cell.

MLC flash memory deviates from SLC flash memory in its logical organization of the data structure. In short, instead of programming the two bits in a single pass of a programming voltage applied to the control gate, the two bits are programmed separately. For example, an MLC cell may be programmed from a starting point of 11 to a 10 level by doing a first pass charging of the floating gate. The upper bit is then programmed using a second pass charging of the floating gate.

In theory, the two bits stored in any NAND cell could be part of the same page. However, for practical reasons, the upper and lower bits of each cell are assigned to separate logical pages. Moreover, in order to simplify programming of upper and lower pages, a generally accepted strategy is to program a number of pages for the lower bit first and then loop back to the same physical bitlines in order to program the upper pages. This second pass also requires the controller to know about the programming state of the target cell in order to select the correct programming pulse.

From the above, it should be understood that SLC NAND flash memory is more robust and easier to program in comparison to MLC and TLC NAND flash memory. Moreover, because of using only a single reference point between the two charge states associated with a digital 0 or 1, SLC flash memory also requires much less precision for the programming. A different way of looking at this is that SLC flash memory is much faster and also much more fault tolerant than MLC flash memory. By extension, this also means that SLC flash memory has a much higher endurance, typically in the range of 50 k to 100 k write cycles as opposed to MLC flash memory with 3 k to 5 k write cycles and TLC flash memory with an estimated 300 to 500 write cycles before reaching the endurance limitation at which cells can no longer be reliably programmed.

The advantages of SLC and MLC flash memory have been combined in hybrid drives using both technologies. In this case, SLC flash memory is used as a first tier or cache and MLC flash memory is used as large capacity storage, thereby taking advantage of the best of both worlds. In any such device, though, the capacities of the SLC and MLC flash memory spaces are fixed, which inadvertently leads to one of the two wearing out faster than the other.

BRIEF DESCRIPTION OF THE INVENTION

The present invention provides a NAND flash-based storage device capable of dynamic allocation of storage capacity to two or more pools of blocks operating in what will be termed as modes of operation, which are defined relative to each other. In particular, a first mode of operation entails programming fewer bits of a NAND cell in fewer passes as compared to a second mode of operation. As a nonlimiting example, the first mode may entail programming one bit of a NAND cell by charging its floating gate in a single pass (similar to that performed with existing SLC flash memory), whereas the second mode of operation entails separately programming two bits of a NAND cell (for example, the lower and upper bits of an MCL NAND cell) by charging its floating gate in two separate passes (similar to that performed with existing MLC flash memory). However, it should also be noted that, because the first and second modes are intended to be relative terms, they also encompass a scenario in which the first mode encompasses the programming of one or two bits of a NAND cell in one or two passes (similar to that performed with existing SLC and MLC flash memory, respectively), while the second mode encompasses the separately programming of three (or more) bits of a NAND cell in three separate passes (similar to that performed with existing TLC flash memory).

One aspect of the invention is a NAND flash memory-based solid state drive having at least one NAND flash memory component that is organized in blocks, pages and cells and defines a memory space partitioned into at least an overprovisioning pool and a user memory pool for host writes and permanent storage, respectively. A first number of the blocks is dynamically assigned to the overprovisioning pool and programming is done to store at least one bit per cell using the first mode of operation, and data is consolidated in a second number of the blocks that are dynamically assigned to the user memory pool and programming is done to store two or more bits per cell using the second mode of operation, wherein the first mode of operation entails programming fewer bits of a cell in fewer passes as compared to the second mode of operation. The solid state drive further comprises means for dynamically cycling the first and second numbers of the blocks between the overprovisioning pool and the user memory pool on demand and based on wear history thereof.

Another aspect of the invention is a NAND flash memory-based solid state drive having at least one NAND flash memory component organized in blocks, pages and cells. Each cell is adapted to store at least two bits. Each block of the NAND flash memory component is adapted to be dynamically configured to store at least one bit per cell using the first mode of operation and dynamically configured to store at least two bits per cell using the second mode of operation while the mass storage device is operating, wherein the first mode of operation entails programming fewer bits of a cell in fewer passes as compared to the second mode of operation.

A third aspect of the invention is a method for increasing write performance and endurance of a NAND flash-based solid state drive having at least one NAND flash memory component organized in blocks, pages and cells with each cell adapted to store at least two bits. The method includes directing all host writes of data to an overprovisioning pool containing a first number of the blocks that are temporarily and dynamically reconfigured to be programmed to store at least one bit per cell using a first mode of operation, and subsequently coalescing the data in a second number of the blocks that are programmed to store two or more bits per cell using a second mode of operation, wherein the first mode of operation entails programming fewer bits of a cell in fewer passes as compared to the second mode of operation.

Another aspect of the invention is a method for increasing write performance of a NAND flash-based solid state drive operating with a host computer and having an array of NAND flash memory components that are organized into blocks and pages and having cells capable of storing at least two bits per cell. The method includes partitioning the array into an overprovisioning pool and a user memory pool, wherein the blocks of the memory components are dynamically allocated to either the over-provisioning pool or the user memory pool. The blocks allocated to the overprovisioning pool are configured to write fewer bits per cell if the write originates from the host computer as compared to the blocks allocated to the user memory pool.

A technical effect of the invention is that, because the first mode is typically restricted to the overprovisioning pool, no loss in capacity is apparent to the user. In addition, because the first mode effectively treats an MLC cell as an SLC cell, the invention is capable of certain benefits of SLC cells, for example, a lower error rate as compared to MLC and the ability to use a simpler form of error checking and correction (ECC) for host writes, thereby reducing load on the ECC engine integrated into a flash memory controller employed to control the NAND memory components. Moreover, since the data are stored only temporarily in the blocks assigned to the overprovisioning pool, stress-induced leakage current (SILO) will have very little effect on charge distribution, thereby again reducing potential error rates. Though appearing somewhat counterintuitive, blocks with marginal functionality and reliability can be preferentially used for fast host writes, and then retired only after exhausting their first mode endurance.

Other aspects and advantages of this invention will be better appreciated from the following detailed description.

BRIEF DESCRIPTION OF THE DRAWINGS

FIG. 1 schematically represents the cycling of blocks of a NAND flash memory component through different functional pools, from an overprovisioning pool ("OP-pool") subjected to host writes in a first mode ("SLC mode") of operation of the memory component for maximum speed, to a shuttle pool ("Shuttle-Pool") and user memory pool ("User Pool") including data coalescence and refresh using a second mode ("MLC mode") of operation for maximum capacity.

DETAILED DESCRIPTION OF THE INVENTION

Although the present invention is generally directed to any NAND flash memory technology with the capability of storing more than a single bit per cell, the following discussion will refer specifically to currently prevailing SLC and MLC NAND flash memory components. As such, as a matter of convenience, the aforementioned first and second modes of operation will be simply referred to below as an "SLC mode" and an "MLC mode," respectively, though these terms should not be interpreted as limiting the broader definitions of the first and second modes, namely, the first and second modes are programming operations performed on a NAND cell adapted to store at least two bits, wherein the first mode entails programming fewer bits of the NAND cell in fewer passes as compared to the second mode. For exemplary illustration, the invention will be further described in reference to a solid state drive that uses NAND flash memory components flexibly configured on a per block basis.

As previously discussed, NAND flash memory components typically used in current SSDs use cells as the smallest data structure. The cells are arranged in daisy chains and multiple daisy chains form a page, which is typically the smallest programmable and readable unit, even though sub-page accesses are possible. Multiple pages are arranged into blocks that are the smallest erasable units. According to a particular aspect of the present invention, individual blocks can also be configured as functional units for use in the SLC and MLC modes of operation, described in more detail below. The internal logic of the NAND flash memory component and/or its interfacing with a NAND flash controller can serve as the means for specifying the SLC and MLC. Other means for controlling the operation of the NAND flash memory component to specify the SLC and MLC modes of operation are also foreseeable and within the scope of the invention. Various aspects of the SLC and MLC modes will be better appreciated from the following discussion regarding different types of write accesses that occur in NAND flash memory components.

In modern SSDs containing flash memory components, two types of write accesses to the flash memory components occur. The first type is a host write and occurs when a host system (personal computer, server, etc.) writes data to the SSD. Data are typically committed in the form of small files that are mapped to individual pages within a block but usually don't completely fill the block they are written to. The remaining unused pages are then programmed in the next write access. This can cause potential problems with corruption of data because of write disturb phenomena when subsequent data are written to the same block. In order to program the block in one single sweep for optimal speed and data integrity, it is advantageous to keep the block size relatively small or else increase the amount of data to be written to the block by write-buffering or write-combining in a volatile memory component such as DRAM or SRAM until the data size matches the block size. In practice, however, buffering the data in volatile memory bears the inherent risk of losing the data in case of a system lock-up or power outage.

A second issue that can arise with host writes relates to stalling of the host system if the host transfer rate is limited by the media transfer rate. In order to avoid excessive queuing of data or potential stalling of the host system, it is highly necessary to offload any traffic from the host system as fast as possible. In other words, the commitment of data to the NAND flash memory components needs to occur as fast and as reliably as possible in order to avoid retries. A possible work-around is the above discussed use of an intermediate DRAM or SRAM cache along with the discussed drawbacks. Accordingly, in the case of host writes to NAND flash memory components, it is highly advantageous to use SLC technology to obtain the speed and reliability advantage.

The second type of write access to flash memory components occurs internally without host intervention if fragmented data are consolidated on the drive through housekeeping functions, for example, data coalescence and garbage collection. The latter are performed during idle periods and run in the background, meaning that they are completely transparent to the user. These operations are carried out primarily when the device is idle, that is, no data are being written or read by the host. The drive's controller scans or "scrubs" the different addresses for the purpose of monitoring error rates and also for consolidating data into the tightest packed format. Tightest packed format or tightest packing means usage of all pages in any given block for valid data, which often includes rewriting of all valid data from several blocks to a fresh block while invalidating the previous blocks. Subsequently, as soon as all data have been copied from the blocks of origin, the latter blocks are erased in order to be available for new write accesses. Use of all pages (and sub-pages) in this context includes physical and logical pages, that is, upper and lower pages or any future logical page organization. In other words, the pages are programmed in MLC or any higher order bit-per-cell mode.

Because of the higher granularity required for programming and threshold detection in MLC technology, it is not possible to use SLC NAND flash in the MLC or any higher order bit-per-cell mode. In contrast, it would be possible to disregard one of the two bits of a cell of an MLC flash memory component and in doing so treat the cell as if it were a single-bit cell of an SLC NAND flash memory component. This capability is the basis for the first or SLC mode of operation, in contrast to the second or MLC mode of operation in which two or more bits are stored per cell of an MLC (or TLC, etc.) flash memory component are utilized.

In the case of blocks of a NAND flash memory component being programmed in the SLC mode, it is possible to employ a first pass programming to write to only the lower pages of the cells within the blocks. Depending on the logical mapping of lower and upper pages within a block into, for example, odd and even page numbers or else alternating blocks of upper and lower pages, the flash memory controller can skip pages associated with the upper bits in MLC cells during programming and only write data to the pages programmable as lower bits during the first pass. Accordingly only "lower" pages within the blocks are programmed, and the cells within these blocks can be described as programmed using the SLC mode of operation provided by the invention. A different way of describing this is that only pages are programmed that would be used if the entire component was configured as an SLC NAND flash memory component. This facilitates the mapping of the data to virtual addresses on the level of the file system because if the upper pages are not programmed with valid data, no pointers are associated pointers with those "left-blank" upper pages. Alternatively, the upper pages can be programmed to the lowest programmable state and flagged as invalid or "don't care" data on the file system level.

An unforeseen benefit of using the SLC mode of operation on an MLC NAND flash component to perform host writes is that the block size is only one-half of what it would be if the MLC mode of operation was used. Consequently, it is easier to completely program the entire "accessible" block without excessive intermediate buffering. This avoids the problem of revisiting a partially written block with the inherent risk of write disturbances.

An alternative aspect of the invention uses the same mechanism to permanently flag as SLC blocks any blocks that have reached the end of their endurance rating for use under MLC operating conditions. Specifically, blocks that can no longer be programmed reliably at a granularity necessary for multi-level detection because of excessive trapping of electrons in the oxide layer or any other factors caused by wear or defects would be expected to continue to reliably work as long as they only store a single bit per cell. In this case, the upper pages would simply appear to the flash memory controller as being already written or otherwise excluded from write accesses. Either way will result in reducing the number of available pages per block to half of the number that are available for use by the MLC mode. Along with the disabling of the upper pages, the handling of the wear-leveling information is updated to match the new mode of operation.

Blocks flagged for permanent use by the SLC mode may be hard-allocated to an over-provisioning pool (OP-pool) receiving all host writes and, after being fully programmed in the SLC mode, may shuttle their payload to a second pool of blocks that are assigned to be programmed using the MLC mode, which is inherently slower but offers twice the capacity. This second pool constitutes the user memory that is visible to the operating system as the user-accessible capacity of the drive. The OP-pool may also contain fully functional blocks that are dynamically configured for use by the SLC mode for achieving a higher write speed.

Management of the OP, shuttle, and user memory pools can be performed on the level of drive firmware. For example, the percentage of raw capacity allocated to the OP-pool can be defined by the firmware and also changes in the programming mode for the different pools can be achieved on the firmware level. The firmware itself can be stored in one or more non-volatile memory components separate from the NAND flash memory components within the OP, shuttle, and user memory pools.

To briefly summarize the above, the present invention can be seen as relating to solid-state mass storage devices, particularly NAND flash-based solid state drives having one or more NAND flash memory IC components that can be conventionally organized into blocks as the minimum erasable structure of the component, with each block containing several pages that constitute the minimum programmable and readable structures of the component. Furthermore, each page contains cells that are individual floating gate transistors capable of having several switching thresholds for the definition of at least four digital values corresponding to a total of at least two bits that can be stored in each cell. The two or more bits of each cell are mapped to at least two logical pages wherein, in the MLC mode of operation, the lower page can be programmed in a first pass charging of the floating gate of the cell, followed by the upper page programmed in a second pass charging of the floating gate. The programming of the lower pages can be done alternating with the programming of the upper pages in an "even/odd" sequence or done in blocks, meaning that a plurality of lower pages is written first, followed by the programming of the upper pages using the same cells. For example, data can be programmed into two, four or eight lower pages in a first pass and then the physical bitline and wordline addresses are revisited to "over-program" the already accomplished floating gate charges with additional charges establishing the second bit for each cell. In principle, the second bit in each cell is already there since the cells have been erased as part of a block erase to a "11" value as the prerequisite for any programming of flash memory. However, until the pages have been programmed, which also includes the association of a pointer with the page or sector, the "11" values present in all cells as baseline are not recognized as valid data by the file or operating system.

The same idea applies in principle to partially programmed cells, in that the lower pages may not be recognized as valid data until the upper pages have also been programmed. However, it is up to the memory controller and a flash translation layer (FTL) in the controller to tell the operating system that partially programmed cells constituting a lower page are valid data and that the upper pages are to be disregarded.

It is not possible to configure a native SLC NAND flash memory component capable of sensing two control gate voltages to only operate in the MLC mode of this invention, which requires the unambiguous identification of four voltage levels. However, there are no technical reasons that a flash memory controller or an MLC NAND flash memory component cannot operate in the SLC mode of this invention by scaling back the number of valid levels from four to two. The current invention takes the concept of using MLC NAND flash in the MLC mode to the next level by implementing a flexible and reversible configuration of individual blocks to work in the MLC or SLC modes based on their logical association with a pool of blocks. Using the physical address of each block undergoing an erase cycle, the logical association with an OP-pool can be used to configure the block to operate in the MLC mode using similar paradigms as what is used in bad-block management. In contrast to simple bad block management, however, a block is not excluded from further use but instead a predefined contingent of page numbers corresponding to upper pages within a given block is temporarily disabled.

According to the above, the default mode of operation of all blocks within the NAND flash memory component is MLC or any multi-bit per cell operation, but individual blocks can be marked for any type of operation using fewer bits per cell. For example, a block operating by default in the two bits per cell MLC mode can be flagged to disallow programming of the upper pages, likewise, a block of a Triple-level cell (TLC) flash memory component capable of storing three bits per cell can be flagged to disregard the highest bit and only allow programming of two bits per cell. Similar strategies may be applied for any number of bits per cell and the "pruning" of the capacity may encompass a single or else several bits per cell. For example a TLC flash memory block may be reconfigured to skip both upper pages to operate in the SLC mode. The configuration of the block can be initiated along with its erase through for example a TRIM command or else be done after the erase cycle has been completed "on the fly" as a function of assigning the block from the user memory pool to the OP-pool as will be described in more detail below.

In the preferred embodiment, a NAND flash-based SSD has multiple MLC NAND flash memory components mounted on a substrate and forming an array connected to a flash controller that also interfaces with a host system. The interface can be of any kind used for storage or other peripheral devices in computer systems. Non-limiting examples are Serial ATA (SATA), Serially Attached SCSI (SAS), Fibre-Channel (FC), Universal Serial Bus (USB) or PCI express (PCIe). A flash translation layer in the flash controller provides logical to physical mapping of file system allocation units to pages of flash or parts thereof.

The raw storage capacity of the SSD is partitioned into a user memory space and an OP pool. Management of the different pools with respect to wear leveling, raw capacity, bad block management and other features is done on the level of the SSD's firmware stored in non-volatile memory excluded from use in any of the aforementioned pools. In most cases, the firmware is stored in a separate non-volatile memory IC component but it is also foreseeable that a hard-partitioned and protected part of the NAND flash memory components could be allocated to storing the firmware of the component.

Blocks within the raw capacity of the NAND flash memory array can be dynamically allocated to the user memory space or else to the OP-pool. As represented in FIG. 1, all blocks can cycle in and out of every pool on demand as part of their normal usage pattern. Depending on the implementation, a third "shuttle" pool ("Shuttle-Pool") can be established as an intermediate or transient state for blocks originating within the OP-pool that have been completely programmed and are prioritized for data consolidation and garbage collection ("GC"), after which the blocks can be reassigned to the user memory pool ("User-Pool") or the OP-pool, depending on need and wear.

One aspect of the invention is that each block cycling into the OP-pool is flagged to be programmable in the SLC mode if a host-write occurs. The SLC mode is established by either skipping the page numbers associated with upper pages containing the second bit in an MLC NAND flash memory component or else by skipping the programming step associated with changing the value of the upper bit in the NAND flash cell from a digital 1 (erased) to a digital 0 (programmed) state and subsequently treating the upper pages as invalid. Alternatively a minimum programming pulse can be applied in order to assure a correct value for the lower pages and avoid a phenomenon known as lower page corruption which can happen if, after programming the lower page, the upper page is not also at least programmed to its least programmed value. It is understood that blocks operating in the SLC mode only show half of the number of pages that they would have if operating in the MLC mode. However, this potential problem of block size mismatch between half and full blocks can be bypassed by skipping the upper pages and flagging them as invalid, similar as they would appear to the file system if the data have been updated or moved to a different page.

All host writes are committed to blocks assigned to the OP-pool. As soon as the blocks are completely programmed, they are virtually assigned to the shuttle pool, meaning that they are prioritized for garbage collection and space reclamation. Specifically, contents of blocks in the shuttle pool are either read into the page buffer, the controller or the cache of the SSD, combined with data of a second block assigned to the shuttle pool and then written to a third block in the MLC mode. As soon as the third block has been completely programmed, it is virtually cycled into the user memory pool where it remains resident until the data get stale or background scrubbing determines an increase in bit error rate, in which case the data are refreshed by writing them to another block. In addition, the block can be subject to space reclamation after files stored therein are invalidated. Depending on the specifications of the NAND flash memory IC, it may also be possible to fill the upper pages of a first shuttle block with the data from the lower pages of a second shuttle block. That is, the block may be reconfigured "on-the-fly" from the SLC to the MLC mode and data consolidation may not require a third block but rather rely on coalescence of data from a second SLC-mode block to fill the upper pages.

As represented in FIG. 1, blocks that are part of the shuttle pool after receiving host writes but which have been invalidated after their data have been copied in packed form to another block are free to be assigned to either user memory pool or else the OP-pool using MLC or SLC mode, respectively. In either case, an erase cycle is necessary, which may be used to provisionally determine one or the other mode. Assignment to either pool is done on demand or else according to wear leveling information stored in the block information record.

In another aspect of the invention, blocks that have been determined as unreliable are not excluded from usage as part of bad block management, instead the MLC mode is blocked and the blocks are permanently or semi-permanently assigned to the OP pool and shuttle pool to operate in the SLC mode. In the SLC mode, the write endurance can be expected to be 10× or 20× greater than that of the same block in the MLC mode. Accordingly, it is expected that those blocks will be able to reliably function for an extended time, thereby significantly offloading write load from blocks within the user memory pool. Periodically such blocks flagged for the SLC mode can be re-evaluated and, if they pass the MLC mode qualification criteria, cycled back into the user memory pool. In addition, it is possible to establish a mixed pool of blocks operating in the SLC and MLC modes in the user memory space. In this case, the use of the SLC mode will result in a certain loss of capacity towards the end of life of a drive, however, this loss of capacity is still substantially smaller than if the blocks were simply flagged as bad blocks.

Overall, the dynamic configuration of blocks as SLC or MLC or simply reduced number of bits per cell for blocks being part of the OP-pool as described has a number of significant advantages. Because the SLC mode is typically restricted to the OP-pool, no loss in capacity is apparent to the user. In addition, because of the lower error rate of SLC compared to MLC, a simpler form of error checking and correction can be used for host writes, thereby reducing load on the ECC engine integrated into the controller. Moreover, since the data are stored only temporarily in the OP-pool blocks, stress-induced leakage current (SILO) will have very little effect on charge distribution, thereby again reducing potential error rates. Finally, even though it appears somewhat counterintuitive, blocks with marginal functionality and reliability can be preferentially used for fast host writes. Only after exhausting their SLC mode endurance will those blocks need to be retired.

After reconfiguring "marginal" blocks to disable the upper pages and write them in the SLC mode only, the wear leveling information pertaining to these blocks needs to be managed in a different manner than that of blocks operating in the MLC mode. This can be done by creating different pools for wear leveling on the controller, thereby allowing a bimodal or, in the case of additional bits per cell, a multi-modal configuration of wear leveling. Alternatively the block information record tracking the number of program/erase cycles can be filtered by applying a simple algorithm to normalize the different program/erase counts for the different modes of operation.

While certain components are shown and described for non-volatile memory-based mass storage devices of this invention, it is foreseeable that functionally-equivalent components could be used or subsequently developed to perform the intended functions of the disclosed components. Therefore, while the invention has been described in terms of a preferred embodiment, it is apparent that other forms could be adopted by one skilled in the art, and the scope of the invention is to be limited only by the following claims.

The invention claimed is:

1. A NAND flash memory-based solid state drive comprising:
at least one NAND flash memory component that is organized in blocks, pages and cells and defines a memory space partitioned into at least an overprovisioning pool and a user memory pool for host writes and permanent storage, respectively, a first number of the blocks being dynamically assigned to the overprovisioning pool and at least one bit per cell is stored in the first number of the blocks using only a first mode of operation, and data being consolidated in a second number of the blocks that are dynamically assigned to the user memory pool and two or more bits per cell are stored in the second number of the blocks using only a second mode of operation; and means for dynamically cycling the first and second numbers of the blocks between the overprovisioning pool and the user memory pool on demand and based on wear history thereof;

wherein the first mode of operation entails programming fewer bits of a cell in fewer passes as compared to the second mode of operation, and all data written by a host computer to the at least one NAND flash memory component are written to the overprovisioning pool using the first mode.

2. A NAND flash memory-based solid state mass storage device comprising:
   a substrate;
   at least one NAND flash memory component on the substrate, the at least one NAND flash memory component being organized in blocks, pages and cells, each of the cells being adapted to store at least two bits;
   a flash memory controller on the substrate;
   an interface on the substrate adapted to functionally connect the mass storage device to a host computer system; and
   a non-volatile memory on the substrate and storing firmware of the mass storage device; and means for dynamically configuring each block to store at least one bit per cell using a first mode of operation and dynamically configuring each block to store two or more bits per cell using a second mode of operation while the mass storage device is operating,
   wherein the at least one NAND flash memory component defines a memory space partitioned into at least an overprovisioning pool and a user memory pool, each of the overprovisioning and user memory pools containing a plurality of the blocks that can be cycled from the overprovisioning pool to the user memory pool, wherein all data written by the host computer system to the storage device are written to the overprovisioning pool, and wherein blocks written to by the host computer system are written in the first mode,
   wherein the first mode of operation entails programming fewer bits of a cell in fewer passes as compared to the second mode of operation.

3. The storage device of claim 2, wherein writing in the second mode includes writing lower and upper bits to the same cell, wherein the lower bits are logically associated with a lower page and the upper bits are logically associated with an upper page, and wherein writing in the first mode includes writing only the lower bit associated with a lower page.

4. The storage device of claim 3, wherein writing in the first mode further includes skipping upper pages when programming a block.

5. The storage device of claim 4, wherein blocks programmed in the first mode are prioritized for data coalescence and space reclamation after all lower pages have been written.

6. The storage device of claim 5, wherein the data coalescence and space reclamation includes copying data from first and second blocks programmed in the first mode into a third block using the second mode followed by erasing the first and second blocks.

7. The storage device of claim 6, wherein each block exhibiting an increased error rate is permanently allocated to the overprovisioning pool to work in the first mode.

8. The storage device of claim 5, wherein the data coalescence and space reclamation includes copying data from a first block programmed in the first mode to a second block programmed in the first mode by using upper pages of the second block in the second mode.

9. The storage device of claim 3, wherein writing in the first mode further includes writing a least programmable charge to upper pages but flagging the upper pages as invalid for a file system.

10. A method for increasing write performance and endurance of a NAND flash-based solid state drive having at least one NAND flash memory component organized in blocks, pages and cells with each cell adapted to store at least two bits, the method comprising:
    directing all host writes of data to an overprovisioning pool containing a first number of blocks that are temporarily and dynamically reconfigured to be programmed to store at least one bit per cell using a first mode of operation; and
    subsequently coalescing the data in a second number of the blocks that are programmed to store two or more bits per cell using a second mode of operation;
    wherein the first mode of operation entails programming fewer bits of a cell in fewer passes as compared to the second mode of operation.

11. A method for increasing write performance of a NAND flash based solid state storage device operating with a host computer and having an array of NAND flash memory components that are organized into blocks and pages and having cells capable of storing at least two bits per cell, the method comprising:
    partitioning the array into an over-provisioning pool and a user memory pool, wherein the blocks of the memory components are dynamically allocated to either the overprovisioning pool or the user memory pool;
    directing all host writes of data to the overprovisioning pool; and
    configuring blocks allocated to the overprovisioning pool to write fewer bits per cell in fewer passes if a write originates from the host computer as compared to blocks allocated to the user memory pool.

12. The method of claim 11, wherein the blocks allocated to the user memory pool are written in a second mode.

13. The method of claim 12, wherein error rates of the blocks of the memory components are monitored and, if an error rate of any one of the blocks written in the second mode exceeds a threshold, the one block is permanently marked to be written in a first mode only.

14. The method of claim 12, wherein data from the blocks written in a first mode are combined in other blocks using the second mode during garbage collection.

15. The method of claim 13, wherein pool management and write mode configuration of the blocks of the memory component is controlled by a firmware stored in a non-volatile memory integrated circuit (IC) component of the storage device.

16. A NAND flash-based solid state drive comprising:
    a substrate;
    at least one NAND flash memory component mounted on the substrate, organized in blocks, pages and cells, and defining a memory space of the solid state drive, the blocks containing at least first and second pages associated with first and second bits stored in each of the cells;
    a flash memory controller operatively coupled to the at least one memory component, the flash memory controller receiving control and data signals from a host computer system, the flash memory controller further being configured through firmware to partition the memory space into an overprovisioning pool and a user memory pool, the controller further allocating the blocks of the at least one NAND flash memory component to the user memory pool and to the overprovisioning pool, and configuring the blocks allocated to the overprovisioning pool to disallow writing data to the second pages, the blocks of the at least one NAND flash memory component further containing third pages associated with third bits stored in each of the cells and configured to disallow writing data to the second and third pages of any one of the blocks if the one block is dynamically allocated to the overprovisioning pool.

17. The solid state drive of claim 16, further disallowing writing data to the third pages if a monitored bit error rate of one of the blocks of the at least one NAND flash memory component exceeds a threshold.

18. The solid state drive of claim 16, wherein the flash memory controller causes all host writes to be written to the blocks dynamically allocated to the overprovisioning pool.

19. A method of increasing endurance of a solid state drive having NAND flash memory components organized in blocks, pages and cells, each of the cells being adapted to store at least two bits, the method comprising:

monitoring a bit error rate of each block; and dynamically reconfiguring a particular block to allow storing of a single bit per cell if the bit error rate of the particular block increases beyond a threshold, wherein the solid state drive is partitioned into an overprovisioning pool and a user memory pool, and all blocks configured to allow storing of a single bit per cell are allocated to the overprovisioning pool, wherein all data written to the solid state drive by a host computer are written to blocks in the overprovisioning pool, and wherein data from the blocks in the overprovisioning pool are consolidated in blocks allocated to the user memory pool using at least two bits per cell.

20. The method of claim 19, wherein wear leveling information of reconfigured blocks is adjusted to match a new configuration thereof.

* * * * *